(12) United States Patent
Tragl et al.

(10) Patent No.: US 10,865,478 B2
(45) Date of Patent: Dec. 15, 2020

(54) METHOD FOR PRODUCING LUMINESCENT PARTICLES WITH A PROTECTIVE LAYER AND LUMINESCENT PARTICLES HAVING A PROTECTIVE LAYER

(71) Applicant: OSRAM Opto Semiconductors GmbH, Regensburg (DE)

(72) Inventors: Sonja Tragl, Augsburg (DE); Tim Fiedler, Landsberg am Lech (DE); Frank Jermann, Königsbrunn (DE)

(73) Assignee: OSRAM OLED GMBH, Regensburg (DE)

( * ) Notice: Subject to any disclaimer, the term of this patent is extended or adjusted under 35 U.S.C. 154(b) by 120 days.

(21) Appl. No.: 16/079,280

(22) PCT Filed: Mar. 1, 2017

(86) PCT No.: PCT/EP2017/054791
§ 371 (c)(1),
(2) Date: Aug. 23, 2018

(87) PCT Pub. No.: WO2017/153226
PCT Pub. Date: Sep. 14, 2017

(65) Prior Publication Data
US 2019/0048466 A1    Feb. 14, 2019

(30) Foreign Application Priority Data

Mar. 8, 2016    (DE) .................. 10 2016 104 194

(51) Int. Cl.
*C23C 16/455* (2006.01)
*C09K 11/02* (2006.01)
(Continued)

(52) U.S. Cl.
CPC ...... *C23C 16/45553* (2013.01); *C09K 11/025* (2013.01); *C09K 11/0883* (2013.01);
(Continued)

(58) Field of Classification Search
CPC ................................. C23C 16/45553
See application file for complete search history.

(56) References Cited

U.S. PATENT DOCUMENTS

| 5,051,277 A | 9/1991 | Sigai et al. |
| 6,458,512 B1 | 10/2002 | Budd et al. |

(Continued)

FOREIGN PATENT DOCUMENTS

| CN | 1323337 A | 11/2001 |
| CN | 1768122 A | 5/2006 |

(Continued)

OTHER PUBLICATIONS

Jeong et al., "Luminescent properties of BaMgAl10O17: Eu2+ blue phosphor grown with SiO2 using atomic layer deposition," 2009, Current Appl. Phys. 9, pp. S249-S251. (Year: 2009).*

(Continued)

*Primary Examiner* — Robert A Vetere
(74) *Attorney, Agent, or Firm* — Slater Matsil, LLP

(57) ABSTRACT

A method for producing phosphor particles with at least one first protective layer and a phosphor particles having at least one protective layer are disclosed. In an embodiment, a method includes providing phosphor particles and applying at least one first protective layer to the surface of the phosphor particles, wherein the at least of first protective layer include depositing a first starting compound by a first atomic layer deposition on the surface of the phosphor particles and depositing a second starting compound by a second atomic layer deposition on the surface of the phosphor particles.

20 Claims, 3 Drawing Sheets

(51) Int. Cl.
*C09K 11/77* (2006.01)
*C09K 11/08* (2006.01)
*C23C 16/30* (2006.01)
*C23C 16/56* (2006.01)

(52) U.S. Cl.
CPC .......... *C09K 11/7734* (2013.01); *C23C 16/30* (2013.01); *C23C 16/45555* (2013.01); *C23C 16/56* (2013.01)

(56) References Cited

U.S. PATENT DOCUMENTS

| | | | |
|---|---|---|---|
| 7,833,437 | B2 | 11/2010 | Fan et al. |
| 7,893,405 | B2 | 2/2011 | Nagano et al. |
| 8,298,666 | B2 | 10/2012 | Fan et al. |
| 8,946,982 | B2 | 2/2015 | Winkler et al. |
| 9,719,013 | B2 | 8/2017 | Fiedler et al. |
| 2006/0263627 | A1* | 11/2006 | Grampeix .............. C09K 11/08 428/690 |
| 2007/0125984 | A1 | 6/2007 | Tian et al. |
| 2007/0172580 | A1* | 7/2007 | Fan ...................... C09K 11/584 427/66 |
| 2007/0298250 | A1 | 12/2007 | Weimer et al. |
| 2015/0284628 | A1 | 10/2015 | Chen et al. |
| 2017/0047409 | A1 | 2/2017 | Iizuka et al. |
| 2018/0044585 | A1 | 2/2018 | Fiedler et al. |
| 2019/0048466 | A1 | 2/2019 | Tragl et al. |

FOREIGN PATENT DOCUMENTS

| | | |
|---|---|---|
| CN | 101855317 A | 10/2010 |
| DE | 69112508 T2 | 2/1996 |
| DE | 102010041525 A1 | 3/2012 |
| DE | 102015103326 A1 | 9/2016 |
| JP | 2008051793 A | 3/2008 |
| JP | 2009524735 A | 7/2009 |
| JP | 2009524736 A | 7/2009 |
| JP | 2011503266 A | 1/2011 |
| JP | 2011068789 A | 4/2011 |
| JP | 2013209570 A | 10/2013 |
| JP | 2013247067 A | 12/2013 |
| JP | 2014532798 A | 12/2014 |
| JP | 2015154028 A | 8/2015 |
| JP | WO2015166572 A1 | 4/2017 |
| JP | 2019509376 A | 4/2019 |
| WO | 2004087831 A1 | 10/2004 |
| WO | 2014128676 A1 | 8/2014 |
| WO | 2014140936 A2 | 9/2014 |
| WO | 2015044106 A1 | 4/2015 |
| WO | 2015052238 A1 | 4/2015 |
| WO | 2015062697 A1 | 5/2015 |
| WO | 2016041838 A1 | 3/2016 |
| WO | 2016173691 A1 | 11/2016 |

OTHER PUBLICATIONS

Watanabe et al., "Synthetic Method and Luminescence Properties of SrxCa1—xAlSiN3:Eu2+ Mixed Nitride Phosphors," 2008, J. Electrochemical Soc. 155, pp. F31-F36. (Year: 2008).*

George, S.M., "Atomic Layer Deposition: An Overview," American Chemical Society, Chem. Rev., vol. 110, 2010, 21 pages.

Jeong, Y.K. et al., "Luminescent Properties of BaMgAl10O17:Eu2+ Blue Phosphor Grown with SiO2 using Atomic Layer Deposition," Current Applied Physics, vol. 9, 2009, 3 pages.

Leskela, M. et al., "Atomic Layer Deposition (ALD): from Precursors to Thin Film Structures," Review, Thin Solid Films, vol. 409, 2002, 9 pages.

Watanabe, H. et al., "Synthetic Method and Luminescence Properties of SrxCa1—xAlSiN3:Eu2+ Mixed Nitride Phosphors," Journal of the Electrochemical Society, vol. 155, 2008, 6 pages.

* cited by examiner

METHOD FOR PRODUCING LUMINESCENT PARTICLES WITH A PROTECTIVE LAYER AND LUMINESCENT PARTICLES HAVING A PROTECTIVE LAYER

This patent application is a national phase filing under section 371 of PCT/EP2017/054791, filed Mar. 1, 2017, which claims the priority of German patent application 10 2016 104 194.7, filed Mar. 8, 2016, each of which is incorporated herein by reference in its entirety.

TECHNICAL FIELD

The present invention relates to a method for producing phosphor particles having a protective layer and to phosphor particles having a protective layer.

BACKGROUND

Phosphors which are capable of converting primary radiation into converted radiation, that is secondary radiation having a longer wavelength, by means of radiation conversion, are frequently very sensitive to hydrolysis. Owing to the hydrolysis of the phosphors, many lighting devices, for example, light-emitting diodes (LEDs) in which a phosphor is arranged in the beam path of a primary radiation source, over time change their color locus in an undesirable manner. Furthermore, the conversion efficiency of the phosphor frequently also decreases greatly on account of the hydrolysis of the phosphor.

In order to reduce such problems, it is known to protect phosphors with silicon dioxide layers which can be applied to the phosphor particles in liquid solution, for example, by hydrolysis of tetraethoxysilane (TEOS). Another possibility is the deposition of a coating material by means of chemical vapor deposition (CVD). However, such methods lead to insufficient protection of the phosphor particles against moisture and/or oxygen.

German Patent Application DE 10 2015 103 326.7 discloses the production of a protective layer on a phosphor particle, wherein the protective layer is produced by treating the phosphor particles with an acid solution within a constant pH range. By means of this method disclosed therein, the phosphor particles are already very well protected against moisture. For the use of hydrolysis-sensitive phosphor particles at very high atmospheric humidity or in moist conditions, however, an even better protection of the phosphor particles is demanded and is therefore desirable.

SUMMARY OF THE INVENTION

Embodiments provide a method for producing phosphor particles having a protective layer. Further embodiments provide phosphor particles having a protective layer, which are improved with regard to the above-mentioned technical problems.

Advantageous embodiments of the method for producing the phosphor particles and advantageous refinements of the phosphor particles with the protective layer are the subject matter of the dependent claims and are also shown in the following description and the figures.

According to an embodiment a method for producing phosphor particles having at least one first protective layer is layer is provided. The method comprises the following method steps: A) provision of phosphor particles and D) application of at least one first protective layer to the surface of the phosphor particles by means of atomic layer deposition.

The method steps mentioned above, and method steps described below, are preferably carried out in the specified order. However, it is possible that, between individual method steps, further, not enumerated method steps are carried out, or that said method steps are carried out exactly in the specified sequence without intermediate steps.

According to at least one embodiment of the method, method step D) comprises the following method steps: D1) deposition of a first starting compound by means of atomic layer deposition on the surface of the phosphor particles, D2) deposition of a second starting compound by means of atomic layer deposition on the surface of the phosphor particles. In particular, the first and the second starting compound are deposited over the entire surface or almost the entire surface, so that the first protective layer completely or almost completely covers the surface of the phosphor particles. Particularly high protection of the phosphor particles against moisture, oxygen and other harmful gases, such as hydrogen sulfide, can thus be ensured. In particular, method steps D1) and D2) are carried out in the specified sequence, that is D1) before D2).

Atomic layer deposition (ALD) can refer to a method in which firstly a first one of at least two gaseous starting compounds is introduced in the chamber in which the phosphor particles are provided, and can be absorbed on the surface of the phosphor particles. In particular, the first starting compound is chemisorbed on the surface of the phosphor particles, which means that the starting compound is chemisorbed to the surface of the phosphor particles in such a way that a chemical bond is formed between the first starting compound and the phosphor particles and that the starting compound is bound to the surface of the phosphor particles. After a preferably complete or almost complete coverage or coating of the surface of the phosphor particles with the first starting compound, the proportion of the first starting compound, which is still gaseous and/or not absorbed on the surface, is removed from the volume and the second of the at least two starting compounds can be supplied. The removal of the first starting compound can be carried out by evacuation or by rinsing the chamber with an inert gas, such as $N_2$ or Ar. The second starting compound can react with the first starting compound absorbed on the surface to form a first protective layer. By means of this deposition method, it is possible to avoid the formation of separate particles of the coating material, that is to say the protective layer, off-site the surface of the phosphor particles. This cannot be prevented, for example, in the case of a CVD method. In particular, the second starting compound reacts directly after its contact with the first starting compound.

By means of the atomic layer deposition, it is possible to deposit the first and the second starting compound in a self-limiting reaction so that the deposition of only one molecular layer takes place. It is thus possible to produce a highly structured and dense first protective layer on the surface of the phosphor particles.

According to one embodiment, the phosphor particles, for example, in the form of a powder, are provided in an ALD coating chamber in method step A). For example, an ALD coating reactor Picosun POCA-100 powder cartridge can be used for the atomic layer deposition.

According to one embodiment, the first protective layer is applied to the surface of the phosphor particles by means of a plasma-assisted atomic layer deposition.

A plasma-enhanced atomic layer deposition (PEALD) method can refer to an ALD method in which the second starting compound is supplied with simultaneous generation of a plasma, as a result of which it can be possible for the second starting compound to be excited. As a result, in comparison to a plasma-free ALD method, the temperature to which the surface is heated can be reduced. The first protective layer can be applied, for example, at a temperature of less than 120° C. and preferably less than or equal to 80° C.

By means of the first protective layer which can be produced within the scope of the method described here, a lower permeability for moisture and/or oxygen can be achieved compared to known protective layers. The first protective layer applied by atomic layer deposition has in particular no or only few channels, pores or grain boundaries which can lead to leaks in conventional protective layers. Therefore, in comparison to a protective layer produced, for example, by means of a CVD method, a higher tightness with regard to moisture and/or oxygen can be achieved.

According to one embodiment, the first starting compound is selected from a group comprising organometallic compounds and metal halides, in particular bromides and chlorides. The second starting compound is selected from a group comprising $H_2O$, $H_2S$, $NH_3$ and/or $O_3$. The first protective layer is formed by a chemical reaction of the first starting compound deposited on the surface of the phosphor particles with the second starting compound.

According to one embodiment, the first protective layer comprises or consists of an oxide, a sulfide, a nitride, a hydroxide, an amide and/or an oxynitride, preferably of an oxide, a sulfide, a nitride, an amide and/or an oxynitride in crystalline or vitreous form. For example, said material can be an oxide, sulfide, nitride, hydroxide, amide and/or oxynitride of boron, aluminum, silicon, tin, zinc, titanium, zirconium, tantalum, niobium or hafnium. It is also possible for the first protective layer to comprise or consist of an oxide and a hydroxide. For example, the first protective layer comprises or consists of an aluminum oxide, such as $Al_2O_3$. In particular, the oxide, sulfide, nitride, hydroxide, amide and/or oxynitride is formed by a chemical reaction of the first and the second starting compound.

According to one embodiment, the metal of the organometallic compound or of the metal halide is selected from a group of metals which comprises boron, aluminum, silicon, tin, zinc, titanium, zirconium, tantalum, niobium and/or hafnium. In particular, the metal is selected from a group of metals which comprises aluminum, silicon and/or zinc; most preferably, the metal is aluminum. In particular, an aluminum-containing first protective layer has proven to be particularly robust against the penetration of water and oxygen.

According to one embodiment, the organometallic compound is selected from metal alkyls and metal alkoxides. In particular, these are metal alkyls or metal alkoxides of boron, aluminum, silicon, tin, zinc, titanium, zirconium, tantalum, niobium and/or hafnium. These compounds can advantageously be sublimated at low temperatures.

According to one embodiment, the first starting compound is selected from a group of compounds comprising $MCl_x$, $MBr_x$, $M(CH_3)_x$, $M(CH_2—CH_3)_x$, $M(CH_2—CH_2—CH_3)_x$, $M(OCH_3)_x$, $M(OCH_2—CH_3)_x$ and $M(OCH_2—CH_2—CH_3)_x$. M stands for B, Al, Si, Sn, Zn, Ti, Zr, Ta, Nb and/or Hf, in particular for Al, Si and/or Zn, and x corresponds to the valence of M, for example, x=4 if m=Zn or Si having a valence of 4. The first starting compound can then, for example, be $Zn(CH_3)_4$, $Zn(OCH_3)_4$, $ZnCl_4$, $ZnBr_4$, $Si(CH_3)_4$, $Si(OCH_3)_4$, $SiCl_4$, or $SiBr_4$.

According to one embodiment, the first starting compound is selected from a group of compounds comprising $AlCl_3$, $AlBr_3$, $Al(CH_3)_3$, $Al(CH_2—CH_3)_3$, $Al(CH_2—CH_2—CH_3)_3$, $Al(OCH_3)_3$, $Al(OCH_2—CH_3)_3$ and $Al(OCH_2—CH_2—CH_3)_3$. The first starting compound is preferably selected from a group of compounds which contains $Al(CH_3)_3$, $Al(CH_2—CH_3)_3$, $Al(OCH_3)_3$ and $Al(OCH_2—CH_3)_3$. Very particular preference is given to the first starting compound $Al(CH_3)_3$ (trimethylaluminum). With a low boiling point of approximately 127° C., trimethylaluminum can be easily vaporized and forms on the surface of the phosphor particles in conjunction with the second starting compound, in particular with $H_2O$ or $O_3$, a first protective layer, which protects the phosphor particles from water and oxygen even in environments with high atmospheric humidity. In addition, trimethylaluminum is commercially available and, further, can be obtained inexpensively.

According to one embodiment, the first starting compound is selected from a group comprising $AlCl_3$, $AlBr_3$, $Al(CH_3)_3$, $Al(CH_2—CH_3)_3$, $Al(CH_2—CH_2—CH_3)_3$, $Al(OCH_3)_3$, $Al(OCH_2—CH_3)_3$ and $Al(OCH_2—CH_2—CH_3)_3$, and the second starting compound is selected from a group comprising $H_2O$, $H_2S$, $NH_3$, and/or $O_3$, preferably $H_2O$, $H_2S$, $NH_3$ and/or $O_3$, particularly preferably $H_2O$ and/or $O_3$. The reaction of the first and second starting compounds gives rise to the first protective layer, which then forms an oxide, sulfide, nitride, hydroxide, amide and/or oxynitride or consists of these compounds. Preferably, a complete or almost complete reaction of the first starting compound takes place. Surprisingly, ozone has proven to be particularly suitable with the first starting compound to produce a first protective layer with particularly high tightness.

For example, trimethylaluminum is selected as the first starting compound and $H_2O$ or $O_3$ is used as the second starting compound. A reaction of the starting compounds produces a first protective layer containing or consisting of an aluminum oxide, for example, $Al_2O_3$. Furthermore, methane gas is formed as a by-product, which is preferably removed from the coating chamber by evacuation or rinsing with an inert gas. Preferably, no methane is therefore contained in the first protective layer. This can advantageously be prevented by the methane being in a gaseous state of aggregation. It can thus be advantageously prevented that undesirable by-products are located in the first protective layer from the reaction of the first and second starting compounds. It is possible for $Al(OH)_3$ to be contained in the first protective layer. In a further method step, the latter can be converted further to form aluminum oxide.

A first protective layer comprising or consisting of aluminum oxide, which is produced by means of trimethylaluminum as the first starting compound and $H_2O$ or $O_3$ as the second starting compound, has proven to be particularly suitable for protecting phosphor particles from harmful influences, in particular against hydrolysis. As a result, the conversion efficiency of phosphor particles which are arranged, for example, in a conversion element of an LED can be kept constant over the service life of the LED. Furthermore, the color locus of the radiation emitted outwards by the LED can advantageously be kept constant or virtually constant over the service life thereof.

According to one embodiment, a first protective layer consisting of one molecular monolayer can be produced by means of the ALD method. Due to the high density and quality of the first protective layer that can be achieved thereby, such a thickness can be sufficient to ensure effective protection against moisture and/or oxygen for the phosphor particles.

According to one embodiment, method step D) is carried out several times. It is thus possible to apply a plurality of first protective layers to the surface of the phosphor particles. By way of example, up to 1000 molecular monolayers can thus be produced. By the repeated deposition of the first protective layer by means of atomic layer deposition, a particularly high tightness and thus a particularly high protection against harmful influences such as water can be achieved.

According to one embodiment of the method, method step D) is repeated various times so that the surface of the phosphor particles is coated with a plurality of first protective layers. For example, said plurality of first protective layers can have a thickness between 1 nm and 500 nm, preferably between 1 nm and 200 nm, particularly preferably between 1 nm and 100 nm. In particular, a layer thickness between 1 nm and 100 nm has proven to be advantageous in relation to sufficient protection and time expenditure for the ALD coating.

By means of the ALD method, it is thus made possible that the thickness of the protective layer is adapted to the requirements or the hydrolysis sensitivity of the phosphor particles.

According to one embodiment, a further method step takes place after method step D): E) tempering the phosphor particles coated with at least one first protective layer at a temperature between 200 and 500° C., preferably between 250 and 400° C., for example, at 350° C.

According to one embodiment, the tempering in method step E) takes place for one to eight hours, for example, for five hours.

According to one embodiment, the tempering in method step E) takes place under an oxygen-containing atmosphere. If residues of the first starting compound, in particular metal halides or organometallic compounds, are still present in the first protective layer, they can be oxidized with the oxygen. For example, gaseous $CO_2$ is formed by the oxidation of trimethylaluminum so that the organic material can be removed from the first protective layer. For example, the oxygen-containing atmosphere is air.

According to one embodiment, the tempering takes place in method step E) under an $H_2$-containing atmosphere.

According to one embodiment, the tempering in method step E) takes place under an inert gas atmosphere. The inert gas atmosphere can be, for example, nitrogen, argon or a forming gas atmosphere (mixture of $H_2$ and $N_2$).

According to one embodiment, hydroxides possibly formed in method step D), such as aluminum hydroxide, can react in method step E) to the corresponding oxide, for example, by dehydration.

According to one embodiment, in method step E) the tempering is carried out at a heating rate of between 1° C. per hour and 100° C. per hour, preferably between 5° C. per hour and 50° C. per hour, more preferably between 10° C. per hour and 20° C. per hour, for example, 13° C. or 14° C. per hour. For example, the heating from room temperature to 350° C. takes place in 24 hours and thus at a heating rate of 13° C. or 14° C. per hour.

According to one embodiment, the phosphor is a silicon-containing and/or aluminum-containing phosphor and before method step D) a further method step B) takes place: B) treating the silicon-containing and/or aluminum-containing phosphor particles with an acid solution, wherein the pH of the acid solution is within a range from pH 3.5 to 7, preferably from pH 4 to 6.5, particularly preferably pH 4.5 to 6, for a period of at least one hour, and wherein a silicon-containing second protective layer is formed on the surface of the phosphor particles, which has a higher content of silicon than the phosphor particles, and/or an aluminum-containing second protective layer is formed on the surface of the phosphor particles, which has an altered content, in particular a reduced content, of aluminum on the surface compared to the phosphor particles. Such a method already leads to a significantly increased stability of the phosphor particles against hydrolysis. With the second protective layer applied thereover, the stability thereof is increased again significantly so that phosphor particles which have been provided with a first and a second protective layer by means of the method according to the invention are particularly suitable for applications in environments with high atmospheric humidity.

In one embodiment, the second protective layer located on the surface of the phosphor particles has an atomic % content of silicon which is at least 40%, preferably at least 60%, higher than that of the phosphor and/or has an atomic % content of aluminum which is reduced compared to the phosphor by at least 10 atomic %, preferably by at least 20 atomic %.

According to one embodiment, after method step B) and before method step D), a further method step is carried out: C) tempering of the treated phosphor particles at a temperature of at least 100° C. In particular, the tempering takes place at temperatures between 300° C. and 450° C., particularly preferably between 300° C. and 350° C. in an oxygen-containing atmosphere.

Furthermore, in method step C) the tempering can also be carried out in an oxygen-containing atmosphere so that there is also the possibility of incorporating further oxygen into the second protective layer. During the tempering, the surroundings of the phosphor particles can preferably be air or mixtures of air and other gases, for example, nitrogen, noble gases, oxygen. During the tempering, a wide range, as far as the heating rate is concerned, can be used; in particular, the heating rate during the tempering can be between 1° C./h and 100° C./h, preferably between 5° C./h and 50° C./h, more preferably between 10° C./h and 20° C./h.

According to one embodiment, the method steps take place in the following order: A), B), C), D), E).

After method step B) or between method step B) and tempering in method step C) or between method step B) and method step D), a method step C1) can be present in which the phosphor particles are dried for two to 20 hours at 40 to 100° C. after the acid treatment. Subsequently, sieving of the phosphor particles is also possible.

The method for producing the second protective layer by means of an acid treatment is disclosed in the patent application DE 10 2015 103 326.7. The method steps disclosed in this patent application and the phosphors are hereby expressly incorporated by reference.

According to one embodiment, all hydrolysis-sensitive phosphor particles can be coated with a first or with a first and a second protective layer by means of the method according to the invention. For example, the following phosphors can be considered: $(Ba_{1-x-y}Sr_xCa_y)SiO_4$:$Eu^{2+}$ ($0 \leq x \leq 1$, $0 \leq y \leq 1$), $(Ba_{1-x-y}Sr_xCa_y)_3SiO_5$:$Eu^{2+}$ ($0 \leq x \leq 1$, $0 \leq y \leq 1$), $Li_2SrSiO_4$:$Eu^{2+}$, $Ca_8Mg(SiO_4)_4Cl_2$:$Eu^{2+}$, oxo nitrides such as $(Ba_{1-x-y}Sr_xCa_y)Si_2O_2N_2$:$Eu^{2+}$ ($0 \leq x \leq 1$; $0 \leq y \leq 1$), $SrSiAl_2O_3N_2$:$Eu^{2+}$, $Ba_{4-x}Ca_xSi_6ON_{10}$:$Eu^{2+}$ ($0 \leq x \leq 1$), $(Ba_{1-x}Sr_x)Y_2Si_2Al_2O_2N_5$:$Eu^{2+}$ ($0 \leq x \leq 1$), $Sr_xSi_{(6-y)}Al_yO_yN_{(8-y)}$:$Eu^{2+}$ ($0.05 \leq x \leq 0.5$; $0.001 \leq y \leq 0.5$), $Ba_3Si_6O_{12}N_2$:$Eu^{2+}$, $Si_{6-z}Al_zO_zN_{8-z}$:$Eu^{2+}$ ($0 \leq z \leq 0.42$), $M_xSi_{12-m-n}Al_{m+n}O_nN_{16-n}$:$Eu^{2+}$ (M=Li, Mg, Ca, Y; x=m/v; v=valence of m, x≤0 2), $M_xSi_{12-m-n}Al_{m+n}O_nN_{16-n}$:$Ce^{3+}$, $AE_{2-x-a}RE_xEu_aSi_{1-y}O_{4-x-2y}N_x$ (AE=Sr, Ba, Ca, Mg;

RE=rare earth metal element), $AE_{2-x-a}RE_xEu_aSi_{1-y}O_{4-x-2y}N_x$ (AE=Sr, Ba, Ca, Mg; RE=rare earth element), $Ba_3Si_6O_{12}N_2:Eu^{2+}$, or nitrides such as $La_3Si_6N_{11}:Ce^{3+}$, $(Ba_{1-x-y}Sr_xCa_y)_2Si_5N_8:Eu^{2+}$, $(Ca_{1-x-y}Sr_xBa_y)AlSiN_3:Eu^{2+}$ (0≤x≤1; 0≤y≤1), $Sr(Sr_{1-x}Ca_x)Al_2Si_2N_6:Eu^{2+}$ (0≤x≤0.2), $Sr(Sr_{1-x}Ca_x)Al_2Si_2N_6:Ce^{3+}$ (0≤x≤0.2), $SrAlSi_4N_7:Eu^{2+}$, $(Ba_{1-x-y}Sr_xCa_y)SiN_2:Eu^{2+}$ (0≤x≤1; 0≤y≤1), $(Ba_{1-x-y}Sr_xCa_y)SiN_2:Ce^{3+}$ (0≤x≤1; 0≤y≤1), $(Sr_{1-x}Ca_x)LiAl_3N_4:Eu^{2+}$ (0≤x≤1), $Ba_{1-x-y}Sr_xCa_y)Mg_2Al_2N_4:Eu^{2+}$ (0≤x≤1; 0≤y≤1), $(Ba_{1-x-y}Sr_xCa_y)Mg_3SiN_4:Eu^{2+}$ (0≤x≤1; 0≤y≤1).

According to a preferred embodiment, the phosphor particles comprise a phosphor which contains an inorganic substance, which comprises in its composition at least the element D, the element Al, the element AX, the element SX and the element NX, wherein D is one, two or more elements from the group Mn, Ce, Pr, Nd, Sm, Eu, Tb, Dy, Ho, Er, Tm, alkali metals (Li, Na, K, Rb, Cs) and Yb; Al represents one, two or more elements from the group of divalent metals which are not included in D; SX represents one, two or more elements from the group of tetravalent metals comprising Si; AX represents one, two or more elements from the group of trivalent metals; and NX represents one, two or more elements from the group O, N, S, C, Cl, F. In particular, the substance has the same crystal structure as $Sr(Sr_aCa_{1-a})Si_2Al_2N_6$. In particular in the case of these phosphors, a first protective layer has proven to be advantageous for use with respect to hydrolysis effects. Conventional coatings protect these phosphors only inadequately from water and/or oxygen.

In the following, a phosphor which has "the same crystal structure as $Sr(Sr_aCa_{1-a})Si_2Al_2N_6$" is defined as a luminous substance which crystallizes in the spatial groups P1, P2, P$\overline{1}$ or P2$_1$.

According to one embodiment, the phosphor is a phosphor having the general formula: $Sr(Sr_aM_{1-a})Si_2Al_2(N,X)_6$:D, A, B, E, G, L In this case M is selected from Ca, Ba, Mg alone or in combination; D is one, two or more elements from the group Mn, Ce, Pr, Nd, Sm, Eu, Tb, Dy, Ho, Er, Li, Na, K, Rb, Cs, Yb, Tm; A is selected from divalent metals different to M and D; B=trivalent metals; E=monovalent metals; G=tetravalent elements; and L=trivalent elements. The following also applies: 0.6≤a<1, preferably 0.6≤a<1 and X represents elements such as, for example, O or halogen, which are also used in particular for landing carrier compensation if occupied intermediate grid locations are present in the crystal lattice or vacancies in grid locations. In particular, the phosphor crystallizes in the space group P1, P2, P2$_1$ or P$\overline{1}$.

According to one embodiment, the phosphor is a phosphor having the general formula: $Sr(Sr_aM_{1-a})Si_2Al_2N_6$:D, wherein M is selected from the group of Ca, Ba, Zn, Mg and D is selected from: Eu and Ce, preferably Eu. Furthermore, the following applies: 0.6≤a<1, preferably 0.8≤a<1. Preferably, M=Ca. In particular, the phosphor crystallizes in the space group P1, P2, P2$_1$ or P$\overline{1}$.

According to one embodiment, the phosphor is a phosphor having the general formula: $Sr(Sr_aCa_{1-a})Si_2Al_2N_6$:D, where D=Eu and 0.8≤a<1, preferably 0.8≤a<1. In particular, the phosphor crystallizes in the space group P1, P2, P2$_1$ or P$\overline{1}$.

In one embodiment, the concentration of D is between 0.1 mol % and 20 mol %, preferably between 0.1% and 10 mol %, or 1 mol % to 10 mol %, based on the concentration of the alkaline earth metals. Very particularly preferably, the concentration of D is between 7 mol % and 10 mol %.

An exemplary embodiment of a phosphor described here can be produced as follows:

As starting materials for the synthesis of the phosphor of the general formula $Sr(Sr_aCa_{1-a})Si_2Al_2N_6$:Eu, the binary nitrides of the constituent elements, that is $Ca_3N_2$, $Sr_3N_2$, AlN and $Si_3N_4$, are used. Since these are highly oxidation-sensitive and hydrolysis-sensitive substances, a so-called glove box is used, under an $N_2$ atmosphere with $O_2$<1 ppm and $H_2O$<1 ppm. In addition, $Eu_2O_3$ is used for the doping with $Eu^{2+}$. A weighing is carried out in such a way that the following atomic ratio is present in a quasi-simplified representation: Sr:Ca:Si:Al:Eu=(1+a):(1−a):2:2:y, wherein y corresponds to the degree of doping, that is the proportion of the divalent lattice sites which are substituted by Eu. In addition, one or different flux agents are added. A reactant mixture is scaled to a total weight of 50-100 g, for example, while maintaining the atomic ratios described above. It is also possible to use other overall weighing scales.

The educt mixture is introduced into a PET mixing container together with $ZrO_2$ balls, for example, and mixed for 6 h on a roller bank in the glove box. The balls are then removed from the mixture and the powder is transferred into a closed molybdenum crucible. Said crucible is introduced into a tungsten crucible, a semi-round open pipe made of tungsten is placed and transferred into a tubular furnace. The tubular furnace is flowed through with forming gas with 92.5% $N_2$ and 7.5% $H_2$ during the running time at 3 l/min. The mixture is heated to 1650° C. at a rate of 250 K/h in the tubular furnace, is held at this temperature for 4 h and subsequently cooled to 50° C. at 250 K/h. The resulting glow cake can be removed after cooling of the furnace, broken using a mortar mill and sieved through a sieve having a mesh size of 31 μm. The sieve fraction <31 μm is the phosphor used or the phosphor particles used, respectively. These phosphor particles can then be used in method step A) and are coated with at least one first protective layer and optionally with a second protective layer.

According to at least one embodiment, a melting agent and/or a flux are used for improving the crystallinity and/or for supporting crystal growth. To this end, chlorides, fluorides, halides and/or boron-containing compounds of the alkaline earth metals are preferably used. Combinations of two or more melting agents or flux agents can also be used. In particular, at least one of the following substances serves as a melting agent and/or as a flux: LiF, LiCl, NaF, NaCl, $SrCl_2$, $SrF_2$, $CaCl_2$, $CaF_2$, $BaCl_2$, $BaF_2$, $NH_4Cl$, $NH_4F$, KF, KCl, $MgF_2$, $MgCl_2$, $AlF_3$, $H_3BO_3$, $B_2O_3$, $Li_2B_4O_7$, $NaBO_2$, $Na_2B_4O_7$, $LiBF_4 \cdot NH_4HF_2$, $NaBF_4$, $KBF_4$, $EuF_3$ and compounds derived therefrom, such as hydrates, are also suitable.

Optionally, the sieving can be followed by impregnation in dilute acid, such as hydrochloric acid, subsequent classification in water and subsequent filtering. The classification can be carried out 3 times, for example. This serves to remove splinters and fines from the phosphor. The process, which can also be referred to as a washing process, additionally serves to obtain a narrower, that is more homogeneous, size distribution of the phosphor particles. The phosphor particles can then be dried. These phosphor particles can then be used in method step A) and are coated with at least one first protective layer and optionally with a second protective layer.

In particular, a phosphor can be used which is described in the PCT patent application PCT/EP 2014/071544. The features, synthesis and properties of the phosphors disclosed therein are hereby fully incorporated by reference.

The invention also relates to phosphor particles which comprise at least one first protective layer. In particular, the phosphor particles can be produced according to one of the methods described above. The features disclosed for the method are therefore also disclosed for the phosphor particles and vice versa.

Phosphor particles are specified. The phosphor particles comprise an Si-containing and/or an Al-containing phosphor, wherein the surface of the phosphor particles is covered with at least one first and one second protective layer and the first protective layer is arranged above the second protective layer. In particular, the at least one first protective layer completely covers the second protective layer. In particular, the at least one first protective layer and the second protective layer are in direct mechanical contact. The second protective layer has a content of Si increased by at least 40 atomic %, preferably at least 60 atomic %, relative to the phosphor and/or a content of Al is reduced by at least 10 atomic %, preferably 20 atom %, compared to the phosphor. The at least one first protective layer comprises a molecular monolayer of a metal oxide, of a metal nitride, a metal sulfide, a metal amide, a metal hydroxide and/or a metal oxynitride or consists of the molecular monolayer.

The metal of the metal oxide, metal nitride, metal sulfide, metal amide, metal hydroxide and/or metal oxynitride can be selected from boron, aluminum, silicon, tin, zinc, titanium, zirconium, tantalum, niobium and/or hafnium. For example, the first protective layer comprises aluminum oxide, such as $Al_2O_3$, or consists thereof.

According to one embodiment, the surface of the phosphor particles is covered with a plurality of first protective layers. Said plurality of first protective layers can have a layer thickness between 1 nm and 500 nm, preferably between 1 nm and 200 nm, particularly preferably between 1 nm and 100 nm.

The specified embodiments of the phosphor particles can be applied for the uses mentioned below. All features of the phosphor particles and the methods for the production thereof are also disclosed for the uses and vice versa.

The invention relates to the use of phosphor particles for converting light into longer-wave light. This is to be understood as meaning that light is absorbed by the phosphor and is emitted as light having a longer wavelength.

The invention relates to the use of phosphor particles in a conversion element. In particular, the conversion element is part of a light-emitting diode (LED).

In one embodiment of the use, the LED has a semiconductor chip which emits blue radiation in the operation in a wavelength range from 400 nm to 500 nm, for example, at 460 nm. A semiconductor chip which is suitable for emitting blue radiation during operation is based, for example, on gallium nitride or indium gallium nitride.

A possible embodiment of the conversion element is the embodiment in the form of a casting wherein the casting comprises a matrix material, such as silicone, and the phosphor particles, and the casting encloses the semiconductor chip in a form-fitting manner. Furthermore, the casting enclosing the semiconductor chip in a form-fitting manner can be stabilized on side walls, for example, by means of a housing, and is located, for example, in a recess of such a housing. Materials for the casting are known to the person skilled in the art.

Furthermore, the conversion element can be embodied as a conversion layer. The conversion layer contains the phosphor particles and a matrix material. In the case of the conversion layer, there is direct contact between the conversion layer and the semiconductor chip wherein the thickness of the conversion layer is, for example, smaller than the thickness of the semiconductor chip and can be, for example, constantly the same at all radiation exit areas of the semiconductor chip.

The conversion element can also take the form of a plate or a film. The plate or the film is arranged above the semiconductor chip. In these further variants of the embodiment of the conversion element, there is not necessarily a direct and/or form-fit contact of the conversion element with the semiconductor chip. This means that a distance can exist between the conversion element and the semiconductor chip. In other words, the conversion element is arranged downstream of the semiconductor chip and is irradiated by the radiation emitted from the semiconductor chip. A casting body or an air gap can then be formed between the conversion element and the semiconductor chip.

BRIEF DESCRIPTION OF THE DRAWINGS

Further advantageous embodiments and developments of the invention result from the exemplary embodiments described below in conjunction with the figures.

In the figures.

DETAILED DESCRIPTION OF ILLUSTRATIVE EMBODIMENTS

Figure 1:
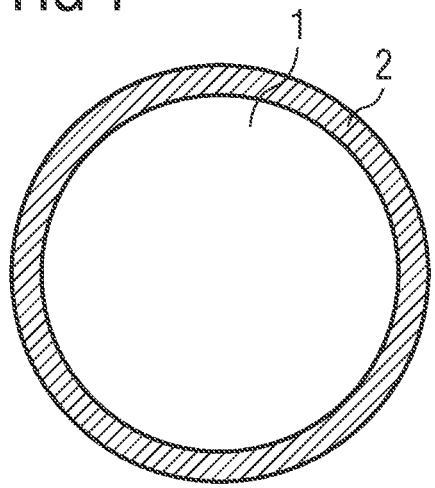
FIGS. 1 and 2 show a schematic drawing of a phosphor particle having at least one first protective layer.

FIG. 1 shows a schematic drawing of a phosphor particle 1, the surface of which is covered with at least one first protective layer 2. The first protective layer 2 can be produced by means of the method according to the invention. For this purpose, for example, phosphor particles of a phosphor of the formula $Sr(Sr_aCa_{1-a})Si_2Al_2N_6$:Eu are provided in a method step A). The first protective layer 2 is applied to the surface of the phosphor particles 1 by means of atomic layer deposition. In a method step D1), a first starting compound, for example, trimethylaluminum, is deposited on the surface of the phosphor particles by means of atomic layer deposition and, in a method step D2) a second starting compound, for example, water or ozone, is deposited on the surface of the phosphor particles by means of atomic layer deposition. Aluminum oxide is formed by a chemical reaction of the trimethylaluminum with the water or the ozone. Methane gas which volatilizes is formed as a by-product. In order to further increase the tightness of the first protective layer, the latter can be tempered at a temperature between 200° C. and 500° C. in a method step E). If the tempering takes place in an oxygen-containing atmosphere, unreacted trimethylaluminum can be converted into aluminum oxide and $CO_2$. Furthermore, in method step E), for example, existing $Al(OH)_3$ can be dehydrated to form aluminum oxide. It can thus be guaranteed that no or almost no organic residues remain in the first protective layer.

Figure 2:
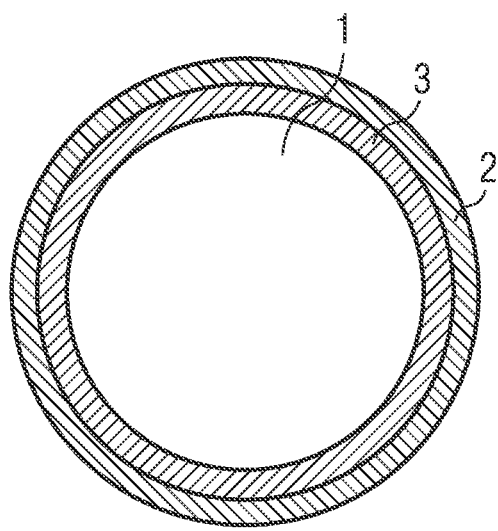

FIG. 2 shows a schematic drawing of a phosphor particle 1, the surface of which is covered with a second protective layer 3 and at least one first protective layer 2. In order to produce said phosphor particles 1, for example, phosphor particles of a phosphor of the formula $Sr(Sr_aCa_{1-a})Si_2Al_2N_6$:Eu are provided in a method step A). In order to produce the second protective layer, for example, 20 grams of a phosphor of the general formula $Sr(Sr_aCa_{1-a})Si_2Al_2N_6$:Eu with a=0.86 and a europium content of 3% (phase purity ≥95%) are added to 200 ml of deionized water and stirred constantly. 6 ml of dilute hydrochloric acid (c=2 mol/l) are added to this dispersion and the mixture is heated to a temperature of 75 to 85° C. The mixture is kept in this temperature range and stirred constantly for five hours. The pH is constantly observed and kept at values of less than 5, by a metering pump being connected to a pH meter. In total, 0.8 ml of dilute hydrochloric acid is added. The phosphor particles leached with the acid are then filtered and extracted with suction and intensively washed first with water and then with ethanol. The phosphor particles are then dried at 60° C. for two hours and then sieved. The dry phosphor particles can optionally be tempered at 350° C. for five hours. The application of the first protective layer 2 to the surface of the phosphor particles 1, in particular onto the second protective layer 3, is carried out by means of atomic layer deposition. In this case, in a method step D1) a first starting compound, for example, trimethylaluminum, is deposited by means of atomic layer deposition on the surface of the phosphor particles and, in a method step D2), a second starting compound, for example, water or ozone, is deposited on the surface of the phosphor particles by means of atomic layer deposition. In order to further increase the tightness of the first protective layer, the latter can be tempered at a temperature between 200° C. and 500° C. in a method step E).

Figure 3:
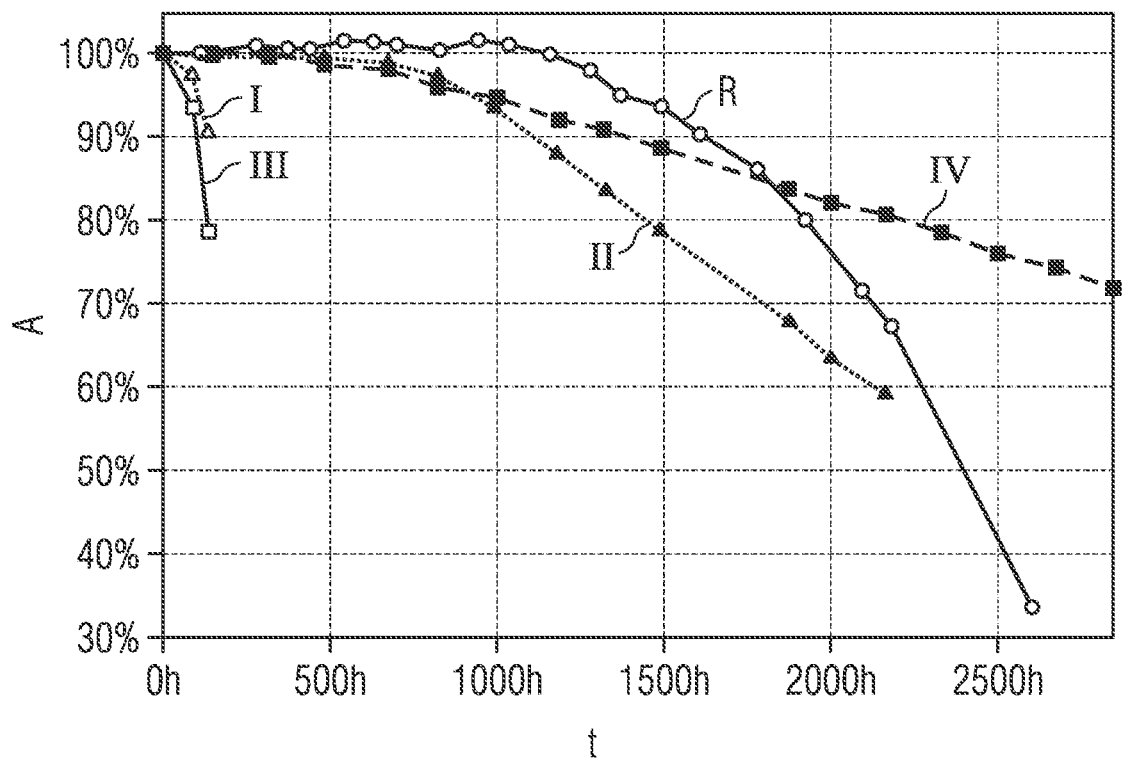
FIGS. 3 and 4 show different degrees of stability for phosphor particles with and without a first protective layer as a function of the duration of a stability test.

FIG. 3 shows different levels of stability for phosphor particles with and without at least one first protective layer, determined on the basis of the relative absorption between 440 and 460 nm as a function of the time duration, during which the phosphor particles were exposed to a so-called PCT test. The time duration (t) of the PCT test is plotted on the x axis and the relative absorption (A) between 440 and 460 nm is plotted on the y axis for the different phosphors.

The PCT test is an accelerated degradation test ("PCT"=Pressure Cooker Test) in which luminescent substance particles are held in a silicone matrix at 100% relative humidity and a temperature of 121° C. The stability of the particles is determined on the basis of the decrease in the relative absorption values of the phosphors in comparison to an absorption value which was measured before the degradation test was started. The degradation test is carried out for 2500 hours.

The curve provided with the reference symbol R shows the course of the relative absorption for phosphor particles which have been coated only with a second protective layer. The second protective layer was produced by adding an adjusted amount of acid as a function of the pH and subsequent tempering, as disclosed in patent application DE 10 2015 103 326.7.

The curve provided with the reference sign I shows the course of the relative absorption for the phosphor particles of the first exemplary embodiment, the curve provided with the reference sign II shows the course of the relative absorption for the phosphor particles of the second exemplary embodiment, the curve provided with the reference sign III shows the profile of the relative absorption for the phosphor particles of the third exemplary embodiment, and the curve provided with the reference sign IV shows the profile of the relative absorption for the phosphor particles of the fourth exemplary embodiment.

The first exemplary embodiment was produced as follows: The phosphor particles of the general formula: $Sr(Sr_aCa_{1-a})Si_2Al_2N_6$:Eu with a=0.86 and a europium content of 3% (phase purity ≥95%) were produced as described above. The resulting glow cake was removed from the furnace after cooling, broken using an agate mortar mill and sieved through a sieve having a mesh size of 31 μm. The sieve fraction <31 μm is the phosphor used or the phosphor particles used, respectively. Said phosphor particles were subsequently impregnated in dilute acid, subsequently classed three times in water and subsequently filtered and extracted with suction. This serves to remove splinters and fines. This washing process also serves to obtain a narrower size distribution of the phosphor particles. As a result of the short impregnation, in particular no second protective layer arises, as would arise when carrying out method step B).

The phosphor particles were then dried. The phosphor particles obtained of the general formula $Sr(Sr_aCa_{1-a})Si_2Al_2N_6$:Eu with a=0.86 and a europium content of 3% were provided in an ALD coating chamber. For example, an ALD coating reactor Picosun POCA-100 powder cartridge can be used for atomic layer deposition. At a deposition temperature of 150° C., trimethylaluminum is first deposited on the surface of the phosphor particles by means of atomic layer deposition. A deposition temperature of 150° C. means that the interior of the coating chamber or the phosphor particles to be coated and the process gases have this temperature. The trimethylaluminum is absorbed on the surface of the phosphor particles. The coating chamber is then flushed with $N_2$ in order to remove excess trimethylaluminum. Subsequently, water impinges on the surface of the phosphor particles. The first protective layer is formed on the surface of the phosphor particles by reaction of the water with the trimethylaluminum. The coating chamber is then flushed with $N_2$ in order to remove excess water and resulting by-products such as methane gas. This deposition process, consisting of deposition of the trimethylaluminum, rinsing with $N_2$, separation of the water and re-flushing with $N_2$ is carried out in total 600 times. This results in a plurality (600) of first protective layers having a layer thickness of 94 nm in total. The layer density can be determined, for example, by means of a reflectometric thin-layer measurement using a silicon wafer as a reference, on which the first protective layer has formed analogously to the surface of the phosphor particles. By means of the rinsing process with $N_2$, a reaction of the trimethylaluminum with the water can already be prevented in the gas phase. This reaction thus takes place only on the surface of the phosphor particles.

The second exemplary embodiment was produced analogously to the first exemplary embodiment. However, in a further subsequent method step, the phosphor particles were tempered at a temperature of 350° C. in an oven in air for five hours and then cooled.

The third exemplary embodiment was produced analogously to the first exemplary embodiment, with the difference that $O_3$ was used as the second starting compound.

The fourth exemplary embodiment was produced analogously to the second exemplary embodiment, with the difference that $O_3$ was used as the second starting compound.

As can be seen, the second and the fourth exemplary embodiments, provided with the reference signs II and IV, have a different degradation behavior compared to the reference R. A slower decrease, almost linear decrease in the relative absorption is observed. In particular, the phosphor particles having a first protective layer which have been heat-treated are distinguished by a very good hydrolysis resistance.

Figure 4:
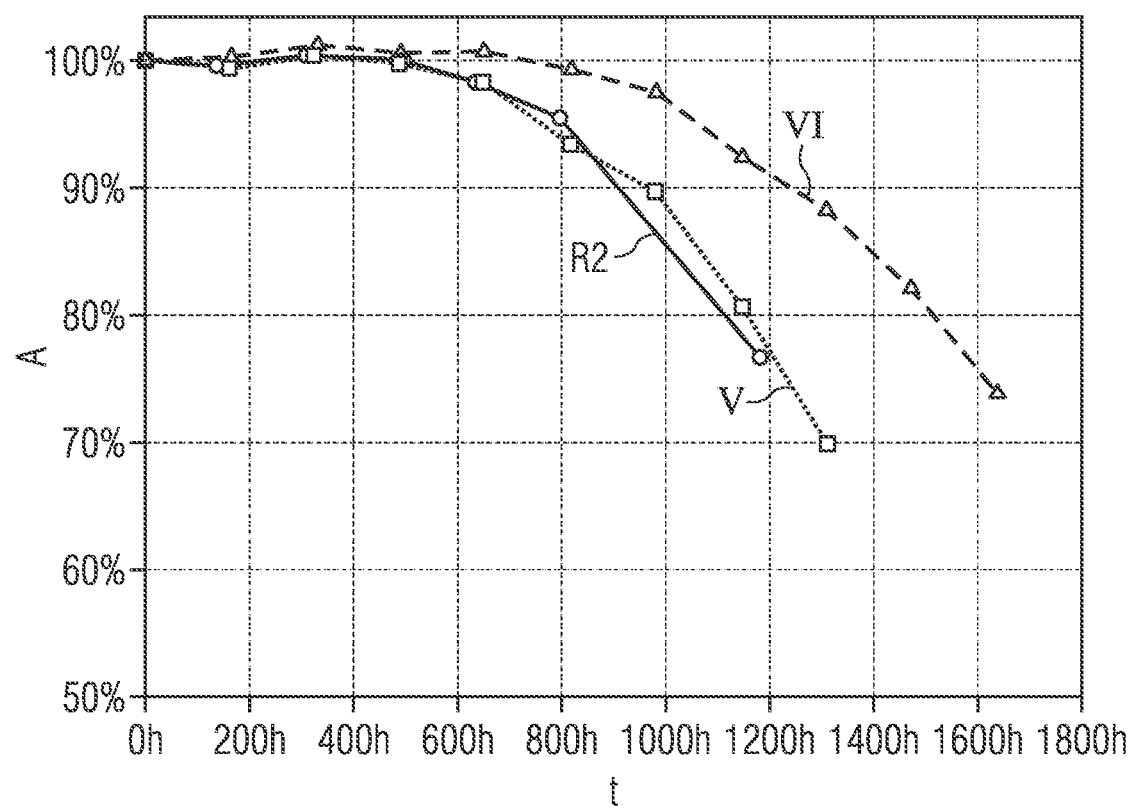

FIG. 4 shows different levels of stability for phosphor particles with and without at least one first protective layer, determined on the basis of the relative absorption as a function of the time duration which the luminous substances were exposed to a PCT test. The time duration of the PCT test is plotted on the x axis and the relative absorption between 440 and 460 nm for the different phosphors is plotted on the y axis. The PCT test corresponds to the test described in connection with FIG. 3. The duration of the test was 1800 hours.

The curve provided with the reference sign R2 shows the course of the relative absorption for phosphor particles which have been coated only with a second protective layer. The second protective layer was produced by adding an adjusted amount of acid as a function of the pH, as disclosed in patent application DE 10 2015 103 326.7.

The curve provided with the reference sign V shows the course of the relative absorption for the phosphor particles of the fifth exemplary embodiment, the curve provided with the reference symbol VI shows the course of the relative absorption for the phosphor particles of the sixth exemplary embodiment.

In the fifth exemplary embodiment, the phosphor particles were first coated with a second protective layer. This second protective layer was produced as described above or in patent application DE 10 2015 103 326.7. In comparison to the third exemplary embodiment, trimethylaluminum and ozone were deposited on the surface of the phosphor particles at a deposition temperature of 250° C. during the production of the first protective layer above the second protective layer. The deposition process, consisting of deposition of the trimethylaluminum, rinsing with $N_2$, separation of the ozone and re-flushing was carried out in a total of 200 times. This results in a plurality of first protective layers having a layer thickness of 18 nm in total.

The sixth exemplary embodiment was produced analogously to the fifth exemplary embodiment. However, in a further subsequent method step, the phosphor particles were tempered at a temperature of 350° C. in an oven in air for five hours and then cooled.

It can clearly be seen that the phosphor particles proven to be most stable are the particles which are provided with a first and a second protective layer and which have been heat-treated after the coating (reference sign VI).

The invention is not restricted to the exemplary embodiments by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. A method for producing phosphor particles with at least one first protective layer, the method comprising:
   providing the phosphor particles; and
   applying the at least one first protective layer to a surface of the phosphor particles, wherein the at least one first protective layer comprises:
      depositing a first starting compound by a first atomic layer deposition on the surface of the phosphor particles; and
      depositing a second starting compound by a second atomic layer deposition on the surface of the phosphor particles,
   wherein a phosphor of the phosphor particles has the general formula:
   $Sr(Sr_aM_{1-a})Si_2Al_2(N,X)_6:Z$,
   wherein Z is selected from the group consisting of D, A, B, E, G, L and combinations thereof,
   wherein M is selected from the group consisting of Ca, Ba, Mg alone and combinations thereof,
   wherein D is selected from one, two or more elements from the group consisting of Mn, Ce, Pr, Nd, Sm, Eu, Tb, Dy, Ho, Er, Li, Na, K, Rb, Cs, Tm and Yb,
   wherein A is selected from divalent metals which are different from M and D,
   wherein B=trivalent metals,
   wherein E=monovalent metals,
   wherein G=tetravalent elements,
   wherein L=trivalent elements, and
   wherein X=O or halogen and $0.6 \leq a < 1$.

2. The method according to claim 1, wherein the first starting compound is selected form the group consisting of organometallic compounds and metal halides, and wherein the second starting compound is selected form the group consisting of $H_2O$, $H_2S$, $NH_3$ and $O_3$.

3. The method according to claim 2, wherein the metal of the organometallic compound or of the metal halide is selected from the group consisting of boron, aluminum, silicon, tin, zinc, titanium, zirconium, tantalum, niobium and hafnium.

4. The method according to claim 1, wherein the first starting compound comprises $MCl_x$, $MBr_x$, $M(CH_3)_x$, $M(CH_2-CH_3)_x$, $M(CH_2-CH_2-CH_3)_x$, $M(OCH_3)_x$, $M(OCH_2-CH_3)_x$ or $M(OCH_2-CH_2-CH_3)_x$, and wherein M is one of B, Al, Si, Sn, Zn, Ti, Zr, Ta, Nb or Hf, and x corresponds to a valence of M.

5. The method according to claim 1, wherein the first starting compound comprises $AlCl_3$, $AlBr_3$, $Al(CH_3)_3$, $Al(CH_2-CH_3)_3$, $Al(CH_2-CH_2-CH_3)_3$, $Al(OCH_3)_3$, $Al(OCH_2-CH_3)_3$ or $Al(OCH_2-CH_2-CH_3)_3$.

6. The method according to claim 1, wherein several first protective layers are applied to the surface of the phosphor particles such that the surface of the phosphor particles is coated with a plurality of first protective layers.

7. The method according to claim 1, further comprising, after applying the at least one first protective layer to the surface of the phosphor particles, tempering the phosphor particles coated with the at least one first protective layer at a temperature between 200° C. and 500° C.

8. The method according to claim 7, wherein tempering the phosphor particles comprises tempering the phosphor particles under an inert gas atmosphere, an oxygen-containing atmosphere or an $H_2$—containing atmosphere.

9. The method according to claim 7, wherein tempering the phosphor particles coated with the at least one first protective layer comprises tempering with an oxygen-containing atmosphere or an $H_2$—containing atmosphere.

10. The method according to claim 1, further comprising, before applying the at least one first protective layer to the surface of the phosphor particles, treating the phosphor particles with an acid solution, wherein a pH of the acid solution is kept within a range of pH 3.5 to 7 for a period of at least 1 h.

11. The method according to claim 10, after treating the phosphor particles with the acid solution, tempering the treated phosphor particles at a temperature of at least 100° C.

12. The method according to claim 10, wherein a Si-containing second protective layer is formed on the surface of the phosphor particles, the second protective layer having a higher content of Si than the phosphor particles.

13. The method according to claim 12, after treating the phosphor particles with the acid solution, tempering the treated phosphor particles at a temperature of at least 100° C.

14. The method according to claim 10, wherein an Al-containing second protective layer is formed on the surface of the phosphor particles, the second protective layer having a modified content of aluminum on the surface compared with the phosphor particles.

15. The method according to claim 14, after treating the phosphor particles with the acid solution, tempering the treated phosphor particles at a temperature of at least 100° C.

16. The method according to claim 1, wherein the phosphor has the general formula: $Sr(Sr_aM_{1-a})Si_2Al_2N_6:D$, wherein M is selected from the group consisting of Ca, Ba, Zn and Mg, and wherein D Eu.

17. A method for producing phosphor particles with at least one first protective layer, the method comprising:
providing the phosphor particles; and
applying the at least one first protective layer to a surface of the phosphor particles, wherein the at least one first protective layer comprises:
depositing a first starting compound by a first atomic layer deposition on the surface of the phosphor particles; and
depositing a second starting compound by a second atomic layer deposition on the surface of the phosphor particles,
wherein a phosphor of the phosphor particles has the general formula: $Sr(Sr_aM_{1-a})Si_2Al_2N_6:D$, wherein M is selected from the group consisting of Ca, Ba, Zn and Mg, and wherein D is selected from the group consisting of Eu and Ce.

18. The method according to claim 17, wherein the first starting compound is selected form the group consisting of organometallic compounds and metal halides, and wherein the second starting compound is selected form the group consisting of $H_2O$, $H_2S$, $NH_3$ and $O_3$.

19. The method according to claim 18, wherein the metal of the organometallic compound or of the metal halide is selected from the group consisting of boron, aluminum, silicon, tin, zinc, titanium, zirconium, tantalum, niobium and hafnium.

20. The method according to claim 17, wherein D is Ce.

* * * * *